(12) United States Patent
Lee et al.

(10) Patent No.: US 8,765,495 B1
(45) Date of Patent: Jul. 1, 2014

(54) METHOD OF FORMING PATTERN OF DOPED REGION

(71) Applicant: United Microelectronics Corp., Hsin-Chu (TW)

(72) Inventors: Yi-Hsiu Lee, Chiayi County (TW); Guo-Xin Hu, Tainan (TW); Qiao-Yuan Liu, Tainan (TW); Yen-Sheng Wang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/863,397

(22) Filed: Apr. 16, 2013

(51) Int. Cl.
*H01L 21/00* (2006.01)

(52) U.S. Cl.
USPC ........ 438/7; 438/5; 438/14; 438/16; 438/369; 438/531; 257/E21.53; 430/5; 430/22; 430/30

(58) Field of Classification Search
None
See application file for complete search history.

(56) References Cited

U.S. PATENT DOCUMENTS

| | | | | |
|---|---|---|---|---|
| 5,723,233 A * | 3/1998 | Garza et al. | ........................ | 430/5 |
| 6,269,472 B1 * | 7/2001 | Garza et al. | ...................... | 716/52 |
| 7,284,231 B2 | 10/2007 | Lucas | | |
| 7,504,183 B2 * | 3/2009 | Hung et al. | ........................ | 430/5 |
| 7,504,184 B2 * | 3/2009 | Hung et al. | ........................ | 430/5 |
| 7,886,254 B2 * | 2/2011 | Huang et al. | .................... | 716/50 |
| 8,042,069 B2 * | 10/2011 | Yang et al. | ........................ | 716/55 |
| 8,321,820 B2 * | 11/2012 | Huang et al. | .................... | 716/53 |
| 8,486,587 B2 * | 7/2013 | Tsai et al. | ........................ | 430/5 |
| 8,524,423 B2 * | 9/2013 | Chiang et al. | .................... | 430/5 |
| 2012/0204135 A1 | 8/2012 | Chung | | |
| 2013/0302724 A1 * | 11/2013 | Yang | ................................ | 430/5 |
| 2014/0040837 A1 * | 2/2014 | Hsieh et al. | .................... | 716/52 |

\* cited by examiner

*Primary Examiner* — Zandra Smith
*Assistant Examiner* — Khanh Duong
(74) *Attorney, Agent, or Firm* — Winston Hsu; Scott Margo

(57) ABSTRACT

A method of forming a pattern of doped region includes the following steps. At first, a device layout pattern including a gate layout pattern and a doped region layout pattern is provided to a computer system. Subsequently, the device layout pattern is split into a plurality of sub regions, and the sub regions have different pattern densities of the gate layout pattern. Then, at least an optical proximity correction (OPC) calculation is respectively performed on the doped region layout pattern in each of the sub regions to respectively form a corrected sub doped region layout pattern in each of the sub regions. Afterwards, the corrected sub doped region layout patterns are combined to form a corrected doped region layout pattern, and the corrected doped region layout pattern is outputted onto a mask through the computer system.

12 Claims, 5 Drawing Sheets

METHOD OF FORMING PATTERN OF DOPED REGION

BACKGROUND OF THE INVENTION

1. Field of the Invention

The present invention relates to a method of forming a pattern of doped regions, and more particularly, to a method of forming a pattern of doped regions on a mask.

2. Description of the Prior Art

With the trend of miniaturization of the electronic products and peripherals, research about thin structures and high integration of the semiconductor devices have become the essential subjects and developing aspects in the industry, and the lithography technology plays an important role to determine the performances of the semiconductor devices.

In semiconductor manufacturing processes, the integrated circuit layout is first designed and formed as a mask pattern. The mask pattern is then proportionally transferred to a photoresist layer disposed on the semiconductor wafer through an exposure process followed by a development process. Subsequently, a corresponding etching process is performed in order to manufacture the semiconductor devices on the semiconductor wafer. Furthermore, a photoresist layer may serve as a mask when an ion implantation process is performed to form lightly doped drain (LDD) regions or doped source/drain regions of the MOS transistor in the semiconductor wafer.

However, during the ion implantation process, the amount of dopant received by the semiconductor wafer may be affected by the formed pre-layer structures and cause micro-loading effects. In other words, since the pre-layer structures are randomly distributed over the semiconductor wafer, after the ion implantation process, the amount of dopant per unit area received by the semiconductor wafer totally exposed will be larger than the amount of dopant per unit area received by the semiconductor wafer partially covered by the pre-layer structures. Therefore, the formed doped regions across the pre-layer structures may suffer unexpected defects such as twists or deformations, which may lower the process yield and the process window. Consequently, how to improve the completeness of the doped regions neighboring the pre-layer structures to increase the efficiency of the semiconductor device, is still an important issue in the field.

SUMMARY OF THE INVENTION

An objective of the present invention is therefore to provide a method of forming a pattern of doped regions in order to enhance the correctness of the mask pattern of said doped regions.

According to one exemplary embodiment of the present invention, a method of forming a pattern of doped regions includes the following steps. At first, a device layout pattern including a gate layout pattern and a doped region layout pattern is provided to a computer system. Subsequently, the device layout pattern is split into a plurality of sub regions, and the sub regions have different pattern densities of the gate layout pattern. Then, at least an optical proximity correction (OPC) calculation is respectively performed on the doped region layout pattern in each of the sub regions to respectively form a corrected sub doped region layout pattern in each of the sub regions. Afterwards, the corrected sub doped region layout patterns are combined to form a corrected doped region layout pattern, and the corrected doped region layout pattern is outputted onto a mask through the computer system.

The doped region layout pattern is first classified into a plurality of sub regions, the sub regions may only include a part of the doped region layout pattern, or simultaneously include a part of the doped region layout pattern and a part of the gate layout pattern, and the OPC calculation is performed on the doped region layout pattern of each of the sub regions to modify the doped region layout pattern according to the pattern density of the gate layout pattern, so as to enhance the correctness of the doped region pattern on the mask. Accordingly, this mask can be used in the ion implantation process to overcome the micro-loading effect caused by the formed gates on the semiconductor wafer, and the doped regions having predetermined shapes and predetermined dopant amounts can be formed on the semiconductor wafer to improve the efficiency of the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
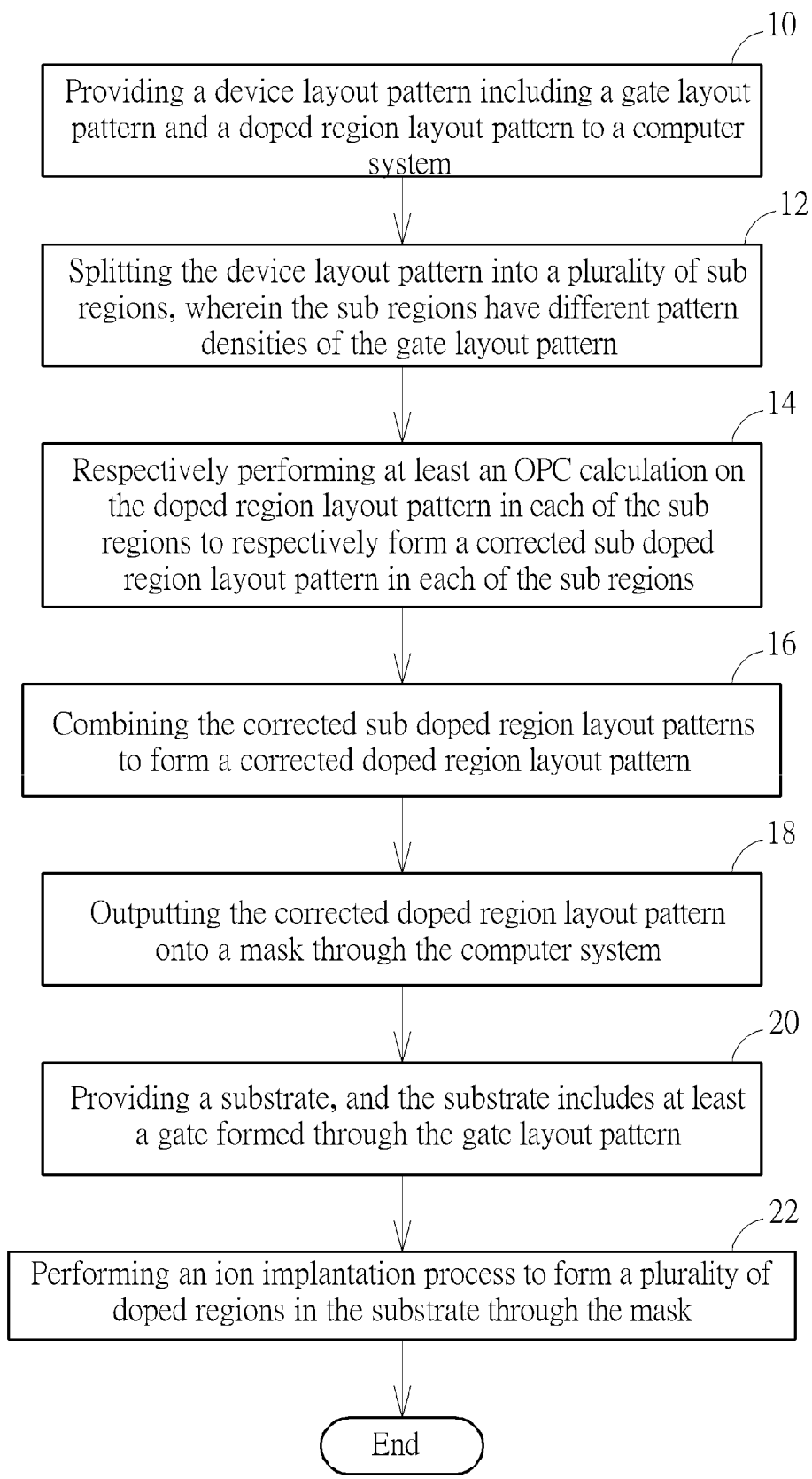
FIG. 1 is a flow chart illustrating a method of forming a pattern of doped region according to a preferred exemplary embodiment of the present invention.

Please refer to FIG. 1 through FIG. 8. FIG. 1 is a flow chart illustrating a method of forming a pattern of doped regions according to a preferred exemplary embodiment of the present invention. FIG. 2 through FIG. 8 are schematic diagrams illustrating a method of forming a pattern of doped regions according to a preferred exemplary embodiment of the present invention. As shown in FIG. 1, a first step 10 is performed.

Step 10 consists in providing a device layout pattern including a gate layout pattern and a doped region layout pattern to a computer system.

Figure 2:
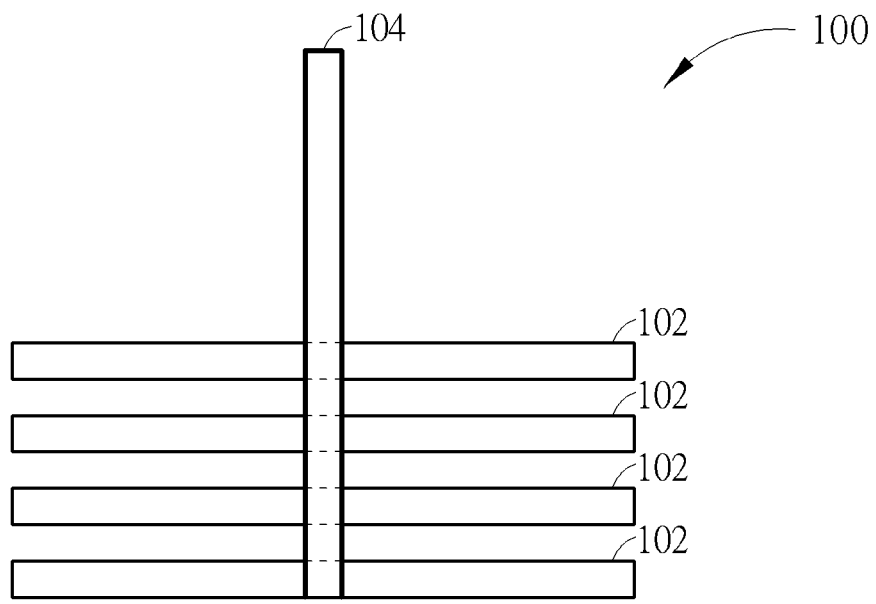
FIG. 2 through FIG. 8 are schematic diagrams illustrating a method of forming a pattern of doped region according to a preferred exemplary embodiment of the present invention.

Please refer to FIG. 2, a device layout pattern is provided to a storage medium such as a computer system, and the device layout pattern which is an ideal pattern supposed to be later transferred on a mask or a target layer such as a photoresist layer on a wafer may include printable patterns used to construct integrated circuits (IC) such as doped region patterns, device patterns, or layout of circuits. In this exemplary embodiment, a device layout pattern 100 includes a gate layout pattern 102 and a doped region layout pattern 104. The gate layout pattern 102 can be later transferred on a gate mask (not shown) to define the predetermined gates to be formed in the active area in a semiconductor substrate. The doped region layout pattern 104 can be later transferred on a doped region mask (not shown) to define the doped predetermined regions to be formed in the active area in a semiconductor substrate, for example, lightly doped drain (LDD) regions or doped source/drain regions. Generally, the doped region process is performed after the gate process. In other words, the gates are formed on the semiconductor substrate before forming the doped regions, and the gates may affect the ion implantation process used for forming the doped regions. More specifically, an amount of dopant per unit area received by the semiconductor substrate totally exposed will be larger than an amount of dopant per unit area received by the semiconductor substrate partially covered by the gates. The formed gates and the doped region mask can be used together to define the shape, the size and the layout of the doped regions, and the doped regions are formed in the active area exposed by the gates. The gate layout pattern 102 and the doped region layout pattern 104 respectively include at least a strip pattern, and the strip pattern of the gate layout pattern 102 and the strip pattern of the doped region layout pattern 104 are perpendicular to each other, but not limited thereto. Then, step 12 is performed.

Step 12 consists in splitting the device layout pattern into a plurality of sub regions, wherein the sub regions have different pattern densities of the gate layout pattern.

Figure 3:
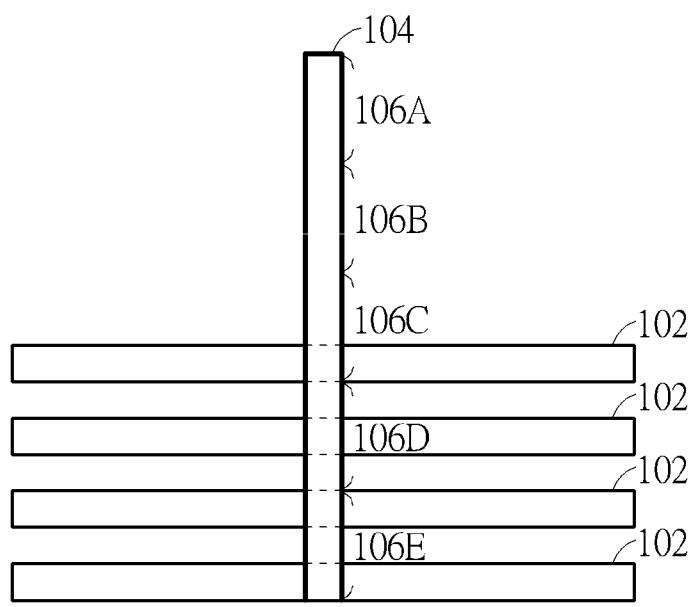

The method of splitting the device layout pattern 100 into sub regions may include the following steps. At first, the device layout pattern 100 is formed on a test mask (not shown), and the lithography process is performed to transfer the device layout pattern 100 to a photoresist layer on the semiconductor substrate. Additionally, this step can be completed through a simulation method. As shown in FIG. 3, the doped region layout pattern 104 is divided into a plurality of sub doped region layout patterns 106A/106B/106C/106D/106E respectively having the same area. Furthermore, a specific software is used to collect the parameters of each of the sub doped region layout patterns 106A/106B/106C/106D/106E, wherein the parameters include a value of mask error enhancement factor (MEEF) and a value of intensity. Subsequently, these parameters are applied in a formula, so that each of the sub doped region layout patterns 106A/106B/106C/106D/106E may have a judgment value. The formula could be expressed as a function, for example, D=f (MEEF, Intensity), wherein D represents the judgment value, and f represents the function of formula. The judgment value D can be used to evaluate if each of the sub doped region layout patterns 106A/106B/106C/106D/106E has a complex contour, a small line width, or a small interval between itself and the neighboring gate layout pattern 102.

More specifically, the MEEF corresponds to the ratio of the deviation of patterns on the photoresist layer on the wafer to the deviation of patterns on the mask. For example, as the MEEF of the pattern gets larger, a same deviation of the pattern on the mask may cause more deviation of the pattern on the photoresist layer on the wafer, and more precision in pattern correction will therefore be required. Accordingly, the judgment value D is positively corresponding to a value of MEEF, and the coefficient of the MEEF in the illustrated formula is preferably a positive number. The intensity corresponds to the light intensity received by the sub doped region layout patterns 106A/106B/106C/106D/106E transferred on the photoresist layer. A larger value of intensity means less neighboring gate layout patterns 102, and a better light receiving rate of the sub doped region layout patterns 106A/106B/106C/106D/106E. In other words, the quality of the transferred patterns on the photoresist layer gets better without being affected by the neighboring gate layout pattern 102. Accordingly, the judgment value D is negatively corresponding to a value of the intensity, and the coefficient of the intensity in the illustrated formula is preferably a negative number.

Figure 4:
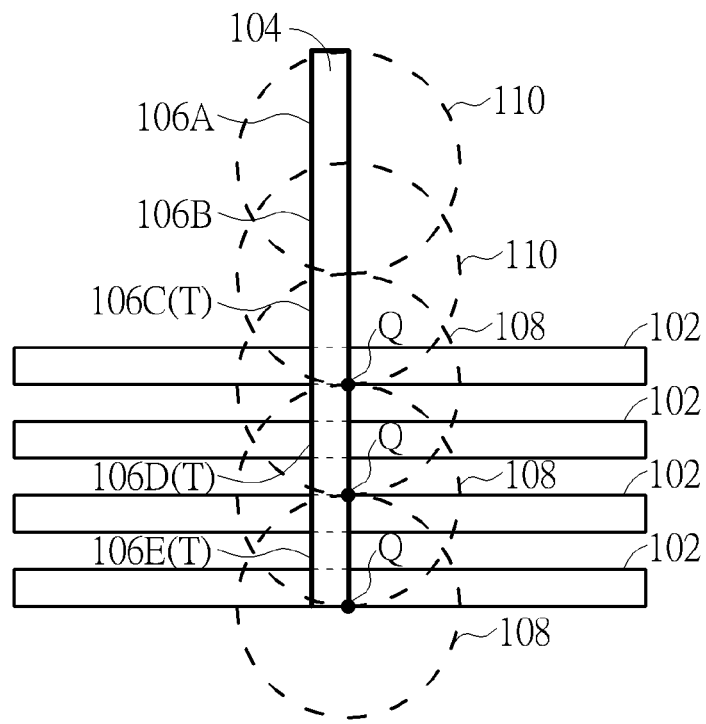

As shown in FIG. 4, the judgment value D of a part of the doped region layout pattern 104 i.e. each of the sub doped region layout patterns 106A/106B/106C/106D/106E is compared with a cut-off value, and the cut-off value may be an unfixed value according to process conditions, such as the pattern density of the layout pattern, the type of light source, or the structure of the light source. In this exemplary embodiment, the sub doped region layout patterns 106C/106D/106E having a judgment value D substantially larger than the cut-off value can be defined as a target pattern T, but not limited thereto. Furthermore, the target pattern T is taken as a reference point, and a specific region is selected. More specifically, a terminal Q of each of the target patterns T may serve as a center, and a specific value is set as radius, therefore, each of the target patterns T may respectively be used to define a circular region as a specific region, and a part of the doped region layout pattern 104 and a part of gate layout pattern 102 contacted by the specific region are all defined as a first sub region 108. Additionally, in a similar method, the other sub doped region layout patterns 106A/106B are respectively taken as reference points, and a specific region is selected to be defined as a second sub region 110. The pattern density of the gate layout pattern 102 in the first sub region 108 is substantially larger than the pattern density of the gate layout pattern 102 in the second sub region 110.

Figure 5:
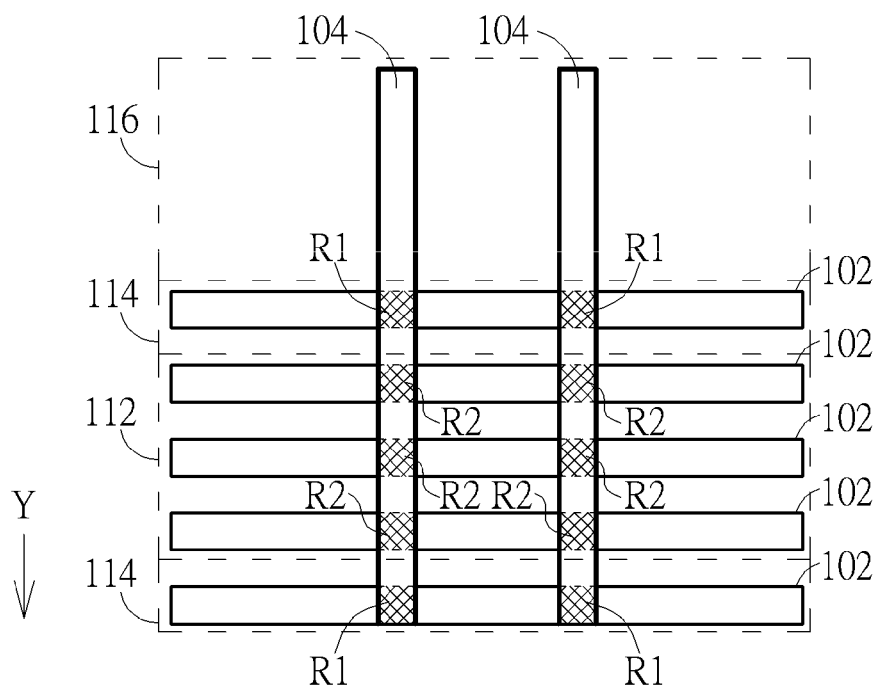

The method of splitting the device layout pattern 100 into the sub regions not limited to the illustrated method may also include the following steps. As shown in FIG. 5, the gate layout pattern 102 and the doped region layout pattern 104 are compared, and the doped region layout pattern 104 overlapping the gate layout pattern 102 is defined as a plurality of reference patterns. The reference pattern neighboring the other reference patterns at only one side is defined as a first reference pattern R1, and the reference pattern neighboring the other reference patterns at both sides is defined as a second reference pattern R2. In other words, the first reference pattern R1 overlaps the outer stripe pattern of the gate layout pattern 102, and the second reference pattern R2 overlaps the inner stripe pattern of the gate layout pattern 102. Moreover, the second reference patterns R2, the doped region layout pattern 104 between the two second reference patterns R2, and the gate layout pattern 102 partially overlapped by the second reference patterns R2 (i.e. the inner stripe patterns of the gate layout pattern 102) are jointly defined as a first sub region 112. The first reference patterns R1, the doped region layout pattern 104 between the first reference patterns R1 and the second reference pattern R2, and the gate layout pattern 102 partially overlapped by the first reference patterns R1 (i.e. the outer stripe patterns of the gate layout pattern 102) are jointly defined as a second sub region 114. The remaining device layout pattern 100 not included in the first sub region 112 and the second sub region 114 can be defined as a third sub region 116. The sub regions have different pattern densities of the gate layout pattern 102. In this exemplary embodiment, the order of the sub regions having the pattern density of the gate layout pattern 102 ranking from a large density to a small density is as following: the first sub region 112, the second sub region 114 and the third sub region 116. The pattern densities of the gate layout pattern 102 in the sub regions increase along a fixed direction Y.

Figure 6:
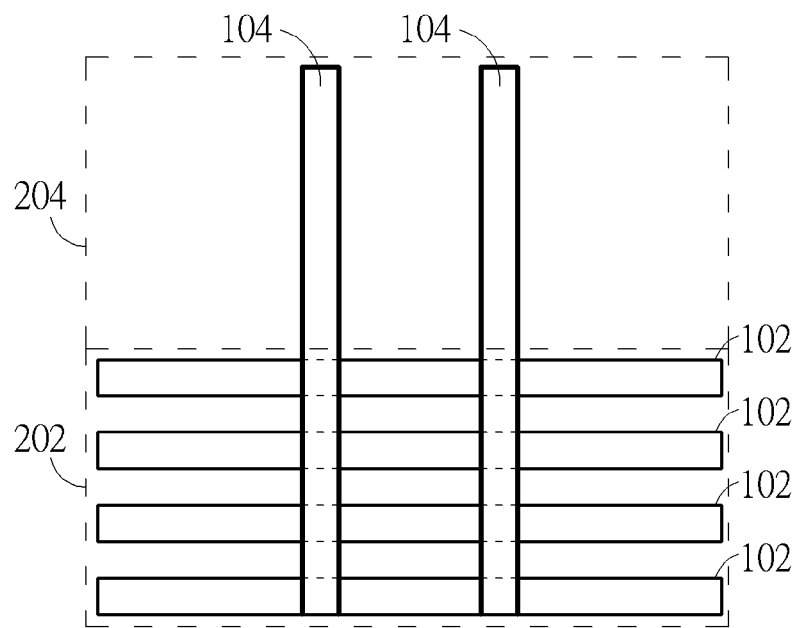

In addition, the device layout pattern 100 could also be directly split into a plurality of sub regions according to the pattern density of the gate layout pattern 102. For example, as shown in FIG. 6, the dense region including the larger pattern density of the gate layout pattern 102 may be defined as a first sub region 202 and the isolated region including the smaller pattern density of the gate layout pattern 102 may be defined as a second sub region 204. The pattern density of the gate layout pattern 102 in the first sub region 202 is substantially larger than the pattern density of the gate layout pattern 102 in the second sub region 204. The number of the sub regions is not limited to two, and can be modified according to the distribution status of the gate layout pattern 102 in the device layout pattern 100.

Step 14 consists in respectively performing at least an optical proximity correction (OPC) calculation on the doped region layout pattern in each of the sub regions to respectively form a corrected sub doped region layout pattern in each of the sub regions.

Step 16 consists in combining the corrected sub doped region layout patterns to form a corrected doped region layout pattern.

After splitting the device layout pattern 100, at least an optical proximity correction (OPC) calculation such as a model-based OPC calculation is performed on the doped region layout pattern 104 in each of the sub regions through the computer system. It is appreciated that, the model-based OPC calculation will not only refer to the contours of the doped region layout pattern 104, but also refer to the corresponding gate layout pattern 102, to modify the doped region layout pattern 104 in each of the sub regions, especially in the sub region simultaneously including a part of the gate layout pattern 102 and a part of the doped region layout pattern 104, such as the first sub region 108 as shown in FIG. 4, the first sub region 112 and the second sub region 114 as shown in FIG. 5, or the first sub region 202 as shown in FIG. 6.

The model-based OPC calculation includes performing an exposure process on a test pattern, and the result of the exposure process is later compared to the original pattern predetermined to be transferred. The deviation between the result of the exposure process and the predetermined original pattern will be collected to determine if any modification is needed, and the degree of the modification can be calculated by the computer system as well according to the deviation. The overall calculation of the computer system is based on the two-dimensional original pattern, and a series of patterns will be added by the calculation result to change the contour of the test pattern, therefore, the error occurring during the pattern transferring process can be compensated, and the calculation can be done many times; accordingly, the accuracy of the model-based OPC calculation is higher for a greater number of calculations done.

In this exemplary embodiment, the model-based OPC calculation can be respectively performed on each of the sub regions to respectively form a corrected sub doped region layout pattern in each of the sub regions. The difference between the corrected sub doped region layout pattern and the corresponding doped region layout pattern, i.e. a modification value of the corrected sub doped region layout pattern, is positively related to the pattern density of the gate layout pattern in each of the sub regions. Subsequently, the corrected sub doped region layout patterns are combined to form a corrected doped region layout pattern.

Figure 7:
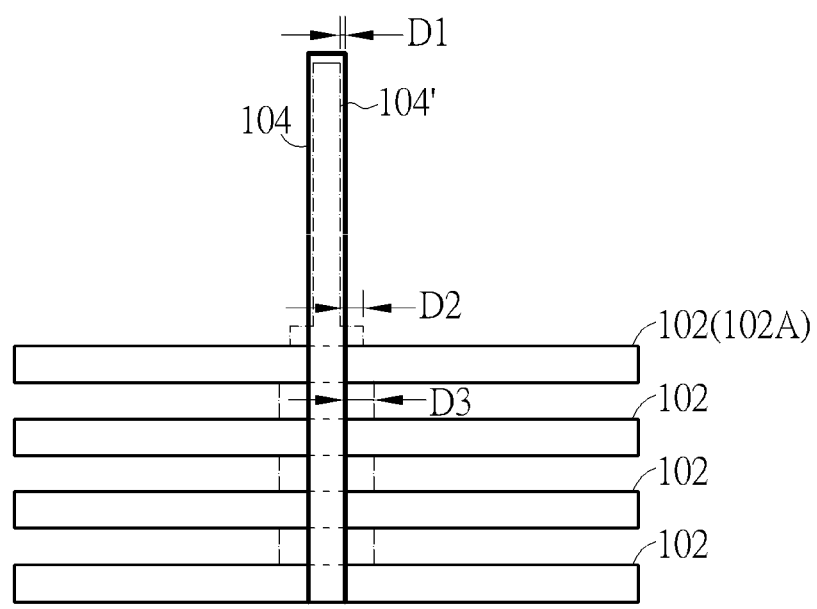

As shown in FIG. 7, the doped region layout pattern 104 includes the stripe patterns predetermined to be formed on a photoresist layer on a semiconductor substrate, and the corrected doped region layout pattern 104' includes the corrected patterns corresponding to the doped region layout pattern 104 after performing the model-based OPC calculation. The difference between the corrected doped region layout pattern 104' and the corresponding doped region layout pattern 104 may be defined as a modification value of the corrected doped region layout pattern 104'. More specifically, an interval between a side of the doped region layout pattern 104 and a side of the corrected doped region layout pattern 104' can be defined as a modification value D1/D2/D3. In order for the doped region layout pattern 104 between two strip patterns of the gate layout pattern 102 to have a predetermined shape and a predetermined dopant amount, a side of the doped region layout pattern 104 may be shifted outwards to enlarge the area of the doped region layout pattern 104 between two strip patterns of the gate layout pattern 102, and the interval between a side of the doped region layout pattern 104 and a side of the corrected doped region layout pattern 104' could be the modification value D3. For example, when a line width of the doped region layout pattern 104 is substantially smaller than 200 nanometers (nm), the modification value D3 can be substantially between 35 nm and 40 nm. The doped region layout pattern 104 neighboring the outer stripe pattern 102A of the gate layout pattern 102 at only one side may be corrected by moving a side of the doped region layout pattern 104 outward as well, in order to avoid an insufficient dopant amount due to the blocking of the gate layout pattern 102. However, a degree of side shifting of the doped region layout pattern 104 neighboring the gate layout pattern 102 at only one side is smaller than a degree of side shifting of the doped region layout pattern 104 neighboring the gate layout pattern 102 at both sides, i.e. the modification value D2 is substantially smaller than the modification value D3. The modification value D2 and the modification value D3 are positively related to the pattern density of the gate layout pattern 102. Moreover, to prevent the formation of the doped region layout pattern 104 without neighboring the gate layout pattern 102 from having an excessively large area or an excessive dopant amount, a side of the doped region layout pattern 104 may be preferably shifted inward. Therefore, the interval between the side of the corrected doped region layout pattern 104' and the side of the corresponding doped region layout pattern 104 could be the modification value D1.

Figure 8:
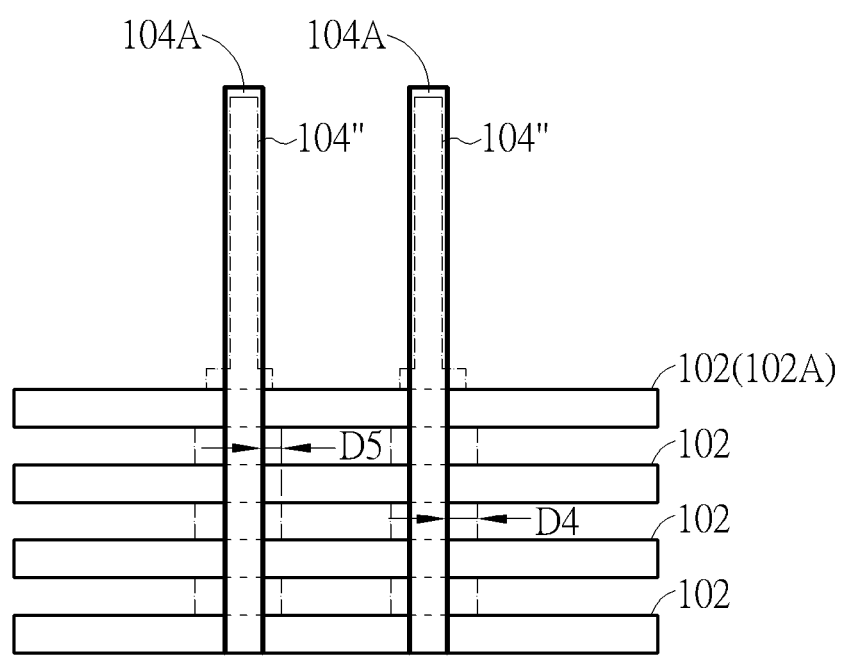

In another exemplary embodiment, as shown in FIG. 8, the doped region layout pattern 104A may include a plurality of stripe patterns. Similarly, in order to improve the correctness of the doped regions formed through the doped region layout pattern 104A between two stripe patterns of gate layout pattern 102 and the doped region layout pattern 104A neighboring the outer stripe pattern 102A of the gate layout pattern 102 at only one side, the sides of the doped region layout pattern 104A are moved outward, and the sides of the doped region layout pattern 104A without neighboring the stripe patterns of the gate layout pattern 102 are preferably moved inward, to form the corrected doped region layout pattern 104''. It is appreciated that, the difference between the corrected doped region layout pattern 104'' and the doped region layout pattern 104A may be smaller between the two stripe patterns of the corrected doped region layout pattern 104'' than that at two sides of the two stripe patterns of the corrected doped region layout pattern 104'', i.e. the modification value D5 is substantially smaller than the modification value D4.

Step 18 consists in outputting the corrected doped region layout pattern onto a mask through the computer system.

Finally, the corrected doped region layout pattern 104' can be outputted onto a mask through the computer system, and the mask is used to define the doped regions predetermined to be formed in the active area in a semiconductor substrate. According to process requirements, before outputting the corrected doped region layout patterns 104' onto the mask, the corrected doped region layout patterns 104' may be checked to see whether they obey the rules of the process rule check (PRC), in order to further confirm the accuracy of the corrected doped region layout patterns 104'. If the corrected doped region layout patterns 104' completely obey the rules of the process rule check, the pattern of the corrected doped region layout patterns 104' is then outputted onto the mask. Conversely, if a part of, or all portions of the corrected doped region layout patterns 104' violate the rules of process rule check, the corrected doped region layout pattern 104' can be partially or overall modified through the computer system.

After forming the mask used to define doped regions, the method of transferring the mask patterns onto the semiconductor substrate may include the following steps.

Step 20 consists in providing a substrate, and the substrate includes at least a gate formed through the gate layout pattern.

Step 22 consists in performing an ion implantation process to form a plurality of doped regions in the substrate through the mask.

At first, a substrate is provided, and the substrate could be a silicon substrate, an epitaxial silicon substrate, a silicon germanium substrate, a silicon carbide substrate, a silicon-on-insulator (SOI) substrate, or a substrate made of other semiconductor materials, but not limited thereto. Furthermore, the substrate includes at least a gate formed through the gate layout pattern 102. Subsequently, a lithography process is performed to transfer a pattern of the mask (i.e. the corrected doped region layout patterns 104') onto a photoresist layer on the substrate to form a patterned photoresist layer, and the patterned photoresist layer exposes a part of the substrate. Afterwards, the patterned photoresist layer may be used as a mask layer to perform the ion implantation process, to form a plurality of doped regions in the substrate at two sides of the gate, wherein the ion implantation process comprises an n-type ion implantation process or a p-type ion implantation process.

In conclusion, the doped region layout pattern is first classified into a plurality of sub regions, the sub regions may include only a part of the doped region layout pattern, or simultaneously include a part of the doped region layout pattern and a part of the gate layout pattern, and the OPC calculation is performed on the doped region layout pattern of each of the sub regions to modify the doped region layout pattern according to the pattern density of the gate layout pattern, in order to enhance the correctness of the doped region patterns on the mask, while the gate layout pattern is not modified. Accordingly, this mask can be used in the ion implantation process to overcome the micro-loading effect caused by the formed gates on the semiconductor substrate, and doped regions having predetermined shapes and predetermined dopant amounts can be formed on the semiconductor substrate to improve the efficiency of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a pattern of doped regions, comprising:
   providing a device layout pattern including a gate layout pattern and a doped region layout pattern to a computer system;
   splitting the device layout pattern into a plurality of sub regions, wherein the sub regions have different pattern densities of the gate layout pattern;
   respectively performing at least an optical proximity correction (OPC) calculation on the doped region layout pattern in each of the sub regions to respectively form a corrected sub doped region layout pattern in each of the sub regions;
   combining the corrected sub doped region layout patterns to form a corrected doped region layout pattern;
   outputting the corrected doped region layout pattern onto a mask through the computer system.

2. The method of forming a pattern of doped regions according to claim 1, further comprising:
   providing a substrate, wherein the substrate comprises at least a gate formed through the gate layout pattern; and
   performing an ion implantation process to form a plurality of doped regions in the substrate through the mask.

3. The method of forming a pattern of doped regions according to claim 2, wherein a method of forming doped regions in the substrate through the mask comprises:
   performing a lithography process to transfer a pattern of the mask onto a photoresist layer on the substrate to form a patterned photoresist layer, wherein the patterned photoresist layer exposes a part of the substrate; and
   using the patterned photoresist layer as a mask layer to perform the ion implantation process.

4. The method of forming a pattern of doped regions according to claim 2, wherein the ion implantation process comprises an n-type ion implantation process or a p-type ion implantation process.

5. The method of forming a pattern of doped regions according to claim 2, wherein the doped regions comprises lightly doped drain (LDD) regions or doped source/drain regions.

6. The method of forming a pattern of doped regions according to claim 1, wherein performing the OPC calculation comprises performing a model-based OPC calculation.

7. The method of forming a pattern of doped regions according to claim 1, wherein the gate layout pattern and the doped region layout pattern respectively comprise at least a strip pattern.

8. The method of forming a pattern of doped regions according to claim 7, wherein the strip pattern of the gate layout pattern and the strip pattern of the doped region layout pattern are perpendicular to each other.

9. The method of forming a pattern of doped regions according to claim 1, wherein the pattern densities of the gate layout pattern in the sub regions increase along a fixed direction.

10. The method of forming a pattern of doped regions according to claim 1, wherein a difference between the corrected doped region layout pattern and the corresponding doped region layout pattern is positively related to the pattern density of the gate layout pattern in each of the sub regions.

11. The method of forming a pattern of doped regions according to claim 10, wherein the difference between the corrected doped region layout pattern and the corresponding doped region layout pattern comprises a modification value of the corrected doped region layout pattern.

12. The method of forming a pattern of doped regions according to claim 11, wherein the modification value comprises an interval between a side of the corrected doped region layout pattern and a side of the corresponding doped region layout pattern.

* * * * *